United States Patent
Lopez Zuleta et al.

(10) Patent No.: US 12,363,478 B2
(45) Date of Patent: Jul. 15, 2025

(54) METHOD AND SYSTEM FOR IMPROVING THE RESTITUTION OF LOW FREQUENCIES OF AN AUDIO SIGNAL

(71) Applicant: Faurecia Clarion Electronics Europe, Paris (FR)

(72) Inventors: Nicolas Lopez Zuleta, Montreuil (FR); Jérôme Noirot, Paris (FR); Jacquemin Vidal, Leuville sur Orge (FR)

(73) Assignee: Faurecia Clarion Electronics Europe, Paris (FR)

( * ) Notice: Subject to any disclaimer, the term of this patent is extended or adjusted under 35 U.S.C. 154(b) by 229 days.

(21) Appl. No.: 18/114,982

(22) Filed: Feb. 27, 2023

(65) Prior Publication Data
US 2023/0276172 A1 Aug. 31, 2023

(30) Foreign Application Priority Data
Feb. 28, 2022 (FR) ..................................... 22 01730

(51) Int. Cl.
*H04R 3/04* (2006.01)
(52) U.S. Cl.
CPC ..................................... *H04R 3/04* (2013.01)
(58) Field of Classification Search
CPC ...................................................... H04R 3/04
See application file for complete search history.

(56) References Cited

U.S. PATENT DOCUMENTS

| | | | | |
|---|---|---|---|---|
| 4,562,591 A | * | 12/1985 | Stikvoort | H03G 7/007 381/106 |
| 11,323,808 B2 | | 5/2022 | Postel et al. | |
| 2010/0086148 A1 | * | 4/2010 | Hung | H03G 5/165 381/98 |
| 2011/0044471 A1 | | 2/2011 | Aarts et al. | |
| 2019/0200126 A1 | | 6/2019 | Postel et al. | |
| 2021/0076132 A1 | | 3/2021 | Postel et al. | |

FOREIGN PATENT DOCUMENTS

FR 3052951 A1 12/2017

OTHER PUBLICATIONS

French search report for French application No. FR 2201730, dated Oct. 13, 2022, 2 pages.

* cited by examiner

*Primary Examiner* — James K Mooney
(74) *Attorney, Agent, or Firm* — Reising Ethington P.C.

(57) ABSTRACT

A method and a system for improving the low-frequency sound reproduction of an audio signal, the sound reproduction being performed by an audio system comprising at least one loudspeaker. The system includes a low-frequency sound enhancement module with filters for separating an input audio signal into a high-frequency signal and a low-frequency signal. The system is configured to implement a first audio processing of the low-frequency signal to obtain a low-frequency output signal and a second audio processing of the high-frequency signal to obtain a high-frequency output signal. The low-frequency sound enhancement module includes, for the first processing of the low-frequency signal, a module for increasing the dynamic range of the low-frequency signal, which is parameterised as a function of at least one transient part of the low-frequency signal.

14 Claims, 7 Drawing Sheets

METHOD AND SYSTEM FOR IMPROVING THE RESTITUTION OF LOW FREQUENCIES OF AN AUDIO SIGNAL

CROSS-REFERENCE TO RELATED APPLICATION

This application claims priority to French Patent Application No. 2201730 filed Feb. 28, 2022, the entire disclosure of which is incorporated by reference herein.

TECHNICAL FIELD

This invention relates to a method and system for improving the low-frequency sound of an audio signal.

BACKGROUND

The invention is in the field of audio signal processing, in particular audio signal processing in music broadcasting audio systems, in order to improve the listening quality of the end user.

It finds a preferred application in the field of optimizing the sound output of audio signals broadcast by one or more loudspeakers of an audio system of a passenger compartment of a transport vehicle, in particular a motor vehicle.

In particular, the invention addresses the problem of boosting the low-frequency range of audio signals, especially in music recordings. As used herein, "low frequencies" are defined as frequencies below 150 Hz.

Low-frequency enhancement systems have been proposed in the state of the art to augment low-frequency sounds that are poorly reproduced by small transducers.

In particular, patent application FR 3 052951 A1 describes a method and system for optimising the low-frequency sound rendering of an audio signal, the method comprising an adjustment of the gain in correlation with the sound level indicated by the volume step chosen by the user. This process does not produce satisfactory results in all cases. This is because the low-frequency adjustment is not based on the content of each audio signal in this case, and the same adjustment is applied to audio signals, e.g. music recordings, with different contents, and from different sources. In some recordings, the sound is too heavy (boomy) because of too much low-frequency boosting.

The invention aims to overcome these disadvantages by providing a method and a system that adapts more finely and automatically to the contents of the audio signal to be played back by an audio system.

SUMMARY

To this end, the invention provides a method of improving the low-frequency sound rendering of an audio signal, the sound rendering being performed by an audio system comprising at least one loudspeaker, the method comprising a separation of an input audio signal by filtering, into a high-frequency signal and a low-frequency signal, a first processing of the low-frequency signal to obtain a low-frequency output signal and a second audio processing of the high-frequency signal to obtain a high-frequency output signal, and a summation of the low-frequency output signal and the high-frequency output signal to obtain an output audio signal provided as input to a set of audio processing blocks of the audio system. In this method, the first processing of the low-frequency signal comprises the implementation of a module for increasing the dynamics of the low-frequency signal, parameterised as a function of at least one transient part of said low-frequency signal.

Advantageously, the method for improving the sound quality of low frequencies uses a module for increasing the dynamic range of the signal (in English "expander") which is parameterised as a function of at least one transient part of the low-frequency signal. For example, the or each transient part corresponds to a signal rise (or attack) from instruments such as percussion. Thus, advantageously, the adjustment of the low-frequency sound rendering is dynamic and based on the content of the audio signal.

The method of sound equalisation of an audio system may have one or more of the following features, taken independently or in any acceptable combination.

The audio signal comprises a musical recording, said method comprising a detection of said low-frequency transient portion comprising at least one attack, said attack corresponding to an amplitude rise of the audio signal.

The method comprises an analysis of the low-frequency signal, said analysis comprising a calculation of a level of the at least one transient part of the low-frequency signal, and an adjustment of at least one parameter of the dynamic range enhancer of the low-frequency signal according to the calculated level.

The adjusted parameter is a slope of the dynamic range enhancer, said slope being calculated as a function of said low-frequency signal level, a first slope value to be applied for predetermined first low level audio signals, and a second slope value to be applied for predetermined second high level audio signals.

The analysis of the low-frequency signal also includes silence detection, and resetting of the dynamics enhancement parameters in case of silence detection.

The method involves calculating a crest factor envelope of the low-frequency signal, and calculating an expansion gain of the dynamic range enhancer based on the crest factor envelope.

The calculation of the crest factor envelope comprises a calculation of a peak envelope of the low-frequency signal, a calculation of an average envelope of the low-frequency signal, the crest factor envelope being equal, at a time instant, to a difference between the peak envelope and the average envelope at said time instant, expressed in decibels.

The method further comprises estimating a level of the output audio signal, representative of an actual output volume of the audio system, based on an estimated level of the input audio signal of the audio system, and a difference between a second intermediate level and a first intermediate level of the audio signal in the audio system, the second intermediate level being the level of a second intermediate signal obtained at the output of a limiter or an output gain of the audio system.

The method further comprises, after application of the dynamic range enhancement module, a phase compensation, to obtain a first output signal of the first low-frequency signal processing.

The first processing further comprises the application of a harmonic generation module to the low-frequency signal, substantially in parallel with the application of the dynamic range enhancement module, and the application of shaping filters, to obtain a second output signal from the first processing of the low-frequency signal.

According to another aspect, the invention relates to a processing system for improving the sound rendering of the low frequencies of an audio signal, the sound rendering being carried out by an audio system comprising at least one loudspeaker, comprising a module for improving the sound rendering of the low frequencies comprising filters for separating an input audio signal into a high-frequency signal and a low-frequency signal, the system being configured to implement a first audio processing of the low-frequency signal to obtain a low-frequency output signal and a second audio processing of the high-frequency signal to obtain a high-frequency output signal, and a summation of the low-frequency output signal and the high-frequency output signal to obtain an output audio signal provided as input to a set of audio processing blocks of the audio system. The low-frequency sound enhancement module comprises, for the said first processing of the low-frequency signal, a module for increasing the dynamics of the low-frequency signal, parameterised as a function of at least one transient part of the said low-frequency signal.

The system for enhancing the low-frequency sound of an audio signal is configured to implement a method of enhancing the low-frequency sound of an audio signal as briefly described above, in any of its alternative implementations.

The system for improving the sound output of the low frequencies of an audio signal may also have one or more of the characteristics below, taken independently or in any technically feasible combination.

The low-frequency sound enhancement module comprises a module for analysing and adjusting the parameters in real time, a module for increasing the dynamics of the low-frequency signal, comprising a silence detection block, a block for calculating the root mean square value of the low-frequency signal, a block for calculating a level of the low-frequency signal and a block for calculating a slope of the module for increasing the dynamics of the low-frequency signal.

The module for improving the sound rendering of low frequencies comprises a module for analysing and adjusting the parameters in real time, a module for increasing the dynamics of the low-frequency signal, comprising a block for calculating the peak of an envelope of the low-frequency signal, a block for calculating the mean square value of the low-frequency signal, a block for calculating an envelope with a crest factor equal to a difference between the peak envelope and the mean envelope expressed in decibels, and a block for calculating the expansion gain as a function of the envelope with the crest factor.

The system further comprises a module for estimating a level of the output audio signal, representative of an actual sound volume at the output of the audio system, comprising a block for estimating a level of the input audio signal of the audio system, and a block for estimating a difference between a second intermediate level and a first intermediate level of the audio signal in the audio system, the second intermediate level being the level of a second intermediate signal obtained at the output of a limiter or an output gain of the audio system.

BRIEF DESCRIPTION OF THE DRAWINGS

Further features and advantages of the invention will become apparent from the detailed description given below, by way of indication and not in any way limiting, with reference to the appended figures, in which.

DETAILED DESCRIPTION OF EMBODIMENTS

Figure 1:
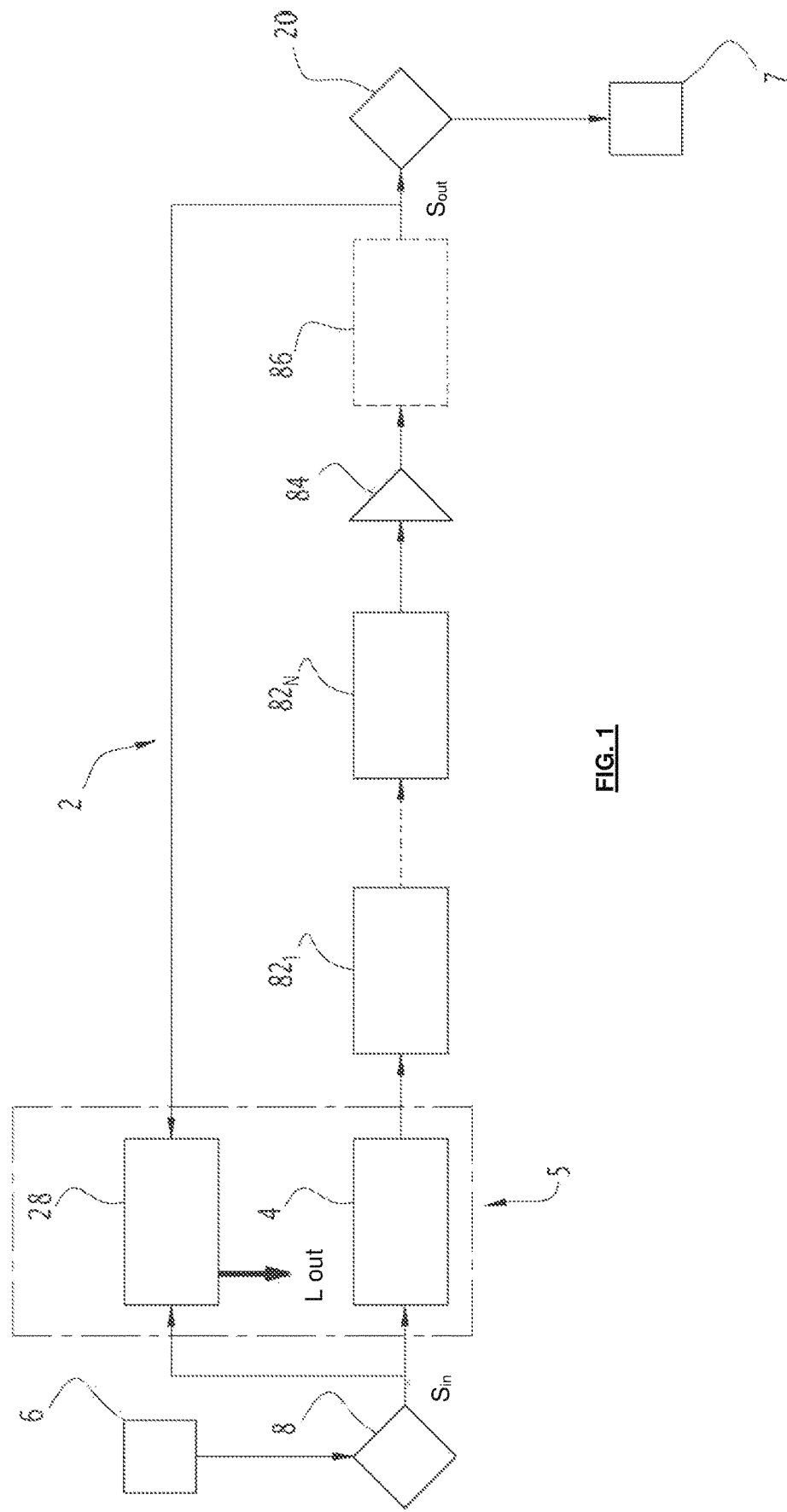
FIG. 1 is a schematic diagram of an audio system comprising a low-frequency enhancement system.

FIG. 1 illustrates schematically the elements of an audio system 2 for the reproduction (or rendering) of an audio signal, for example, which can be integrated into the interior of a motor vehicle (not shown).

The audio system 2 includes a system 5 for enhancing the low-frequency sound of an audio signal, the system 5 including a low-frequency sound enhancement module 4 and an output audio signal level estimation module 28, which will be described in detail below.

The audio system 2 has a source 6 of audio signals, for example a car radio, mp3 player, etc, which provides an audio signal at an input 8. Of course, there are several types of audio signal sources 6 that can provide the audio signal to be played back by the audio system 2.

For example, source 6 provides a succession of musical recordings (or tracks) forming a playlist selected by a user.

The audio system 2 also includes one or more amplifiers 7 to power the speakers.

At the output of the low-frequency sound enhancement module 4, the system 2 has N audio processing blocks referenced $82_1$ to $82_N$, which perform various audio processing functions that are not further described here. It also includes a gain 84 to allow a user to adjust the output level, and a volume limiter 86 to limit the output sound pressure (or output sound volume), at the output 20 of audio system 2, so as to avoid unpleasant volume saturation for a user.

In the following, the low-frequency sound enhancement system 5 is described in various embodiments. One of the advantages is to implement a process and a system that automatically adapts to the sound level played, in real time, and to any type of musical piece (a more or less recent recording), from any source.

Indeed, the inventors have found that the characteristics of recorded audio signals vary depending on when they were recorded, and the need for audio enhancement differs depending on the recording characteristics.

Figure 2:
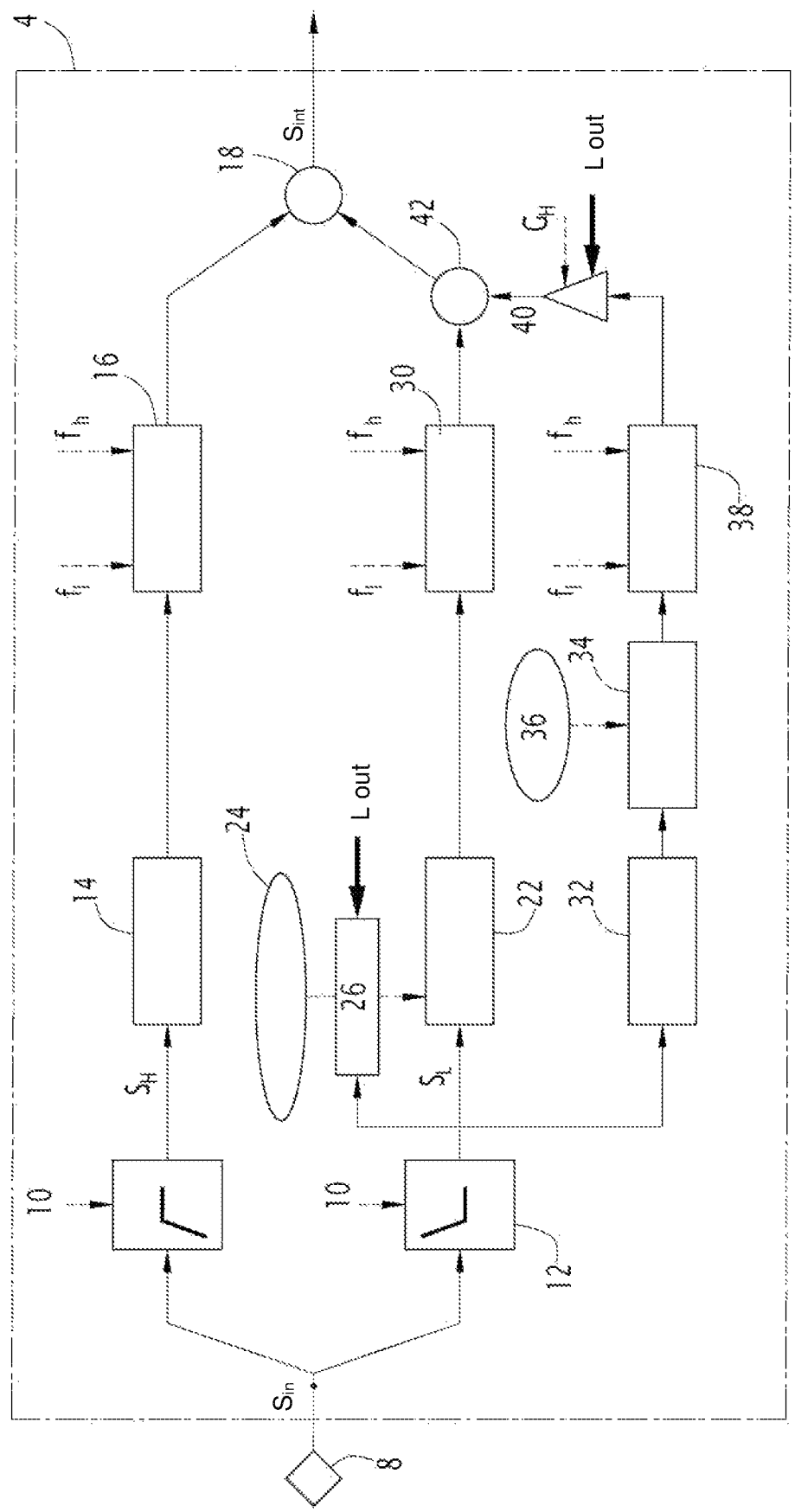
FIG. 2 schematically illustrates a module for improving the low-frequency sound of an audio signal.

FIG. 2 illustrates schematically the elements of the module 4 for improving the low-frequency sound of an audio signal.

As shown in FIG. 1, this module 4 is placed at the input of the audio system 2.

The input audio signal $S_{IN}$ is first processed by the implementation of filters, respectively a high-pass filter 10 and a low-pass filter 12, thus separating the input audio signal into a high-frequency signal $S_H$ and a low-frequency signal $S_L$.

The cut-off frequency $f_0$ is used to perform the frequency separation to generate the high-frequency signal $S_H$ comprising frequencies greater than or equal to $f_0$ and the low-frequency signal $S_L$ comprising frequencies lower than $f_0$ respectively. The cut-off frequency $f_0$ is a predetermined system parameter, for example between 50 and 150 Hz.

Module 4 implements a first low-frequency signal processing, which will be described in more detail below, and a second high-frequency signal processing.

The second processing of the high-frequency signal is performed by applying a time delay compensation module 14 and a phase compensation module 16.

The delay compensation module 14 implements a look-ahead delay, corresponding to the delay of the first processing performed on the low-frequency signal. This compensation makes it possible to obtain a high-frequency signal at the output of the second process synchronised with the low-frequency signal at the output of the first process before the summation 18 of these two signals to obtain the output audio signal of the module 4.

The phase compensation module 16 implements shaping frequencies, respectively a low frequency $f_l$ and a high frequency $f_h$. Any known phase compensation module can be used. This compensation makes it possible to obtain a perfect recomposition of the high-frequency signal at the output of the second processing with the low-frequency signal at the output of the first processing during the summation 18 of these two signals to obtain the output audio signal of the module 4.

The module 4 for improving the low-frequency sound of an audio signal comprises several modules contributing to the first processing of the low-frequency signal.

The low-frequency signal $S_L$ from the low-pass filtering 12 is input to a module 22 for enhancing the dynamic range of the low-frequency signal.

The dynamic range expansion module 22 is also called the expander module.

The module 22 is for example a dynamic range control module or DRC module, more specifically specialised for dynamic range expansion.

The dynamic range of an audio signal is the ratio of its maximum sound level to its minimum sound level.

The dynamic range expansion module 22 is intended to increase the dynamic range of the signal, depending on a set of parameters 24, at least some of these parameters being adjusted according to the embodiments described below.

The parameters 24 include on the one hand predetermined parameters, the value of which is for example provided by a sound engineer during calibration: a trigger threshold Thr, an attack duration T_att, a release duration T_rel, an anticipation delay D, as well as a first parameter $B_1$ for low-level reinforcement and a second parameter $B_2$ for high-level reinforcement.

In addition, dynamic range expansion slope and dynamic range expansion gain parameters are used by module 22.

As is known in the field of sound level dynamics control, the attack is a transient portion corresponding to the rise in the amplitude of the audio signal, and the release is a transient portion corresponding to a fall in the amplitude of the signal. Of course, a sound signal from a musical recording has several transient parts, attacks and releases, throughout the piece.

For example, in a low-frequency signal of a musical recording, the attacks correspond to percussive sounds, such as bass drum, double bass, etc.

The attack time T_att is a predetermined time duration that is compared to the trigger threshold Thr to trigger the operation of the audio signal dynamics enhancement module 22.

The release time T_rel is a predetermined time duration that is compared to the trigger threshold Thr to trigger the audio signal dynamics enhancer 22 to return to a neutral state.

The parameters 24 also include operating parameters of the module 22 that are calculated or adjusted in real time, in particular a dynamic range slope and a gain.

At least some of the operating parameters of the audio signal dynamics enhancement module 22, e.g. slope and gain, are calculated as a function of at least one transient portion, and more particularly at least one attack of the low-frequency signal $S_L$.

A module 26 for real-time analysis and adjustment of the parameters is implemented.

Modes of implementation of the module 26 will be described below.

The module 26 performs an analysis of the low-frequency signal $S_L$ and provides a dynamically adapted slope value.

In addition, at least part of the parameters of the audio signal dynamics enhancement module 22 are dependent on an estimated level of the output audio signal, referenced L_out.

The estimated level L_out is for example provided by the output audio signal level estimation module 28 (shown in FIG. 1), an embodiment of which will be described below with reference to FIG. 6.

The real-time parameter analysis and adjustment module 26 implements a detection of one or more low-frequency transient parts each comprising at least one attack corresponding to an amplitude rise of the audio signal.

The output of the audio signal dynamics enhancement module 22 is provided as an input to a phase compensation module 30, similar to the phase compensation module 16 described above.

The modules 22, 30 perform a first part of the first processing consisting of an increase in the dynamic range of the low-frequency signal, which is adaptive according to the content of the low-frequency signal, and in particular the attacks.

At the output of the module 30 a first output signal of the first low-frequency signal processing is obtained.

The first processing also includes a second part of-low-frequency signal processing, including harmonic generation.

The first and second parts of the first treatment are performed in parallel.

In the second part, the low-frequency signal $S_L$ is input to a time delay compensation module 32, similar to the time delay compensation module 14 which has the effect of compensating for the delay introduced by the first processing of the module 22 applied to the low-frequency signal.

The output of module 32 is provided as an input to a harmoniser module 34, which is parameterised by parameters 36 that specify the type of harmonics to be added.

Module 34 and its parameters are not described in more detail here, as it is a common processing of an audio system.

The output of the harmonic generation module 34 is provided as an input to a shaping module 38, configured to apply low-pass and high-pass filtering, of frequencies $f_l$ and $f_h$, respectively.

The signal obtained at the output of the shaping module 38 is amplified by an amplifier 40, the gain of which is based on a harmonic gain $G_H$, the value of which is for example predetermined by a sound engineer during a calibration, the gain being dynamically adjusted according to the estimated level L_out of the output audio signal A second output signal from the first low-frequency signal processing is obtained at the output of the amplifier 40.

The first output signal of the first low-frequency signal processing and the second output signal of the first low-frequency signal processing are summed by an adder module 42 to obtain the low-frequency output signal, provided at the input of the adder 18. The high-frequency signal at the output of module 16 and the low-frequency signal at the output of adder module 42 are added together to obtain the output signal of the low-frequency enhancement module 4.

Some or all of the modules described are realised by digital processing, implemented by one or more digital processing units, for example DSP (Digital Signal Processors), specialised in signal processing.

Figure 3:
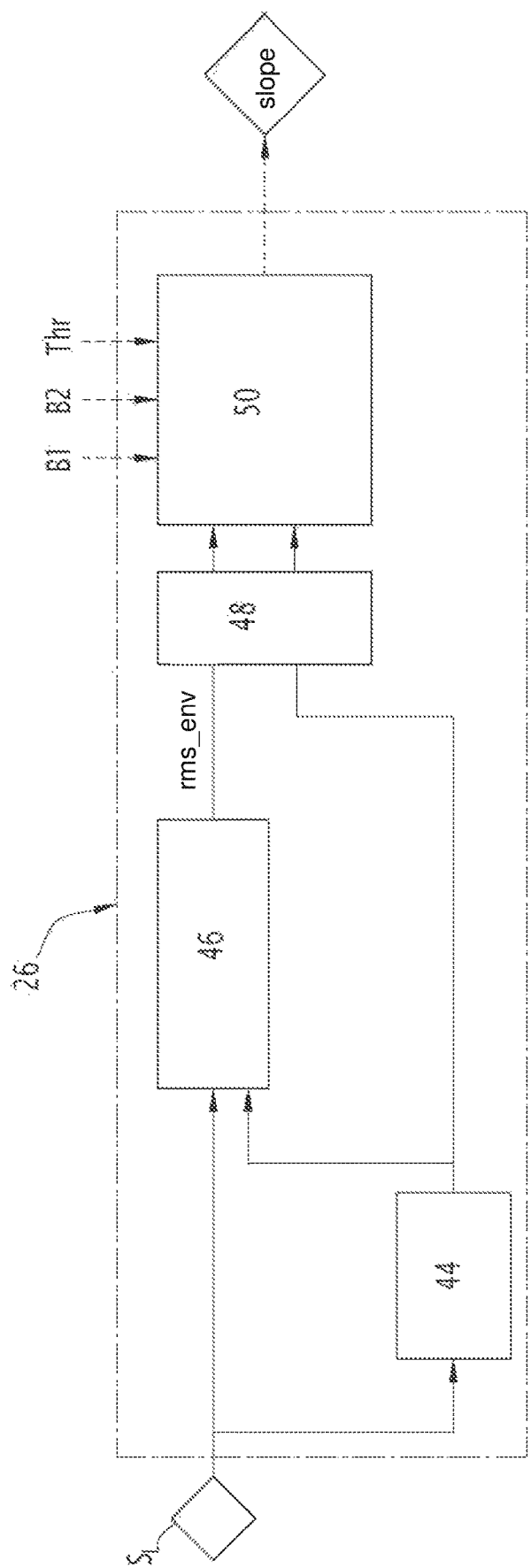
FIG. 3 shows schematically a first embodiment of a module for analysing a low-frequency audio signal and adjusting the parameters of a dynamics enhancement module.

FIG. 3 shows schematically the first mode, known as adaptive, of implementation of the module 26 for analysing and adjusting the parameters of the module 22 for increasing the dynamics as a function of the signal.

In this embodiment, the module 26, which receives the low-frequency signal $S_L$ as input, comprises the following functional blocks:
- a silence detection block 44, designed to detect transitions between two separate music recordings;
- a block 46 for calculating the root mean square (RMS) value of the envelope of the audio signal supplied at the input of the module 26, for example a first-order infinite impulse response filter (IIR filter);
- a block 48 for calculating a level L(t) of the audio signal based on the results of blocks 44 and 46, and
- a dynamic slope calculation block 50 for the dynamic increase module 22.

More generally, block 46 calculates an average envelope of the input audio signal, which is the low-frequency signal $S_L$ in the low-frequency sound enhancement module 4.

The slope s(t) is dynamically adjusted over time as a function of the calculated signal level L(t), the first low-level enhancement parameter $B_1$ and a second high-level enhancement parameter $B_2$. The first parameter $B_1$ is representative of a gain level, in dB, to be applied to low level audio signals $L_b$, and the second parameter $B_2$ is a gain level, in dB, to be applied to high level audio signals $L_h$.

The parameters $B_1$, $B_2$ are for example predetermined, i.e. set by default or are provided by a user via a man-machine interface not shown.

The calculation of the dynamically adjusted slope s(t) is similar to a linear interpolation between two operating regions, a low level region and a high level region respectively, according to the dynamically calculated signal level L(t), essentially in real time.

An embodiment of a process implemented by the blocks 44, 46, 48 and 50 described above is described below with reference to FIG. 4.

The method receives an input signal which is the low-frequency signal $S_L$.

The parameters $B_1$, $B_2$ are received and stored beforehand.

The method comprises a step 52 of calculating the root mean square or RMS value of the envelope of the low-frequency signal $S_L$, at time t.

Any method of calculating the root mean square value of the envelope is applicable.

In one embodiment, a first-order IIR filter, parameterised by an integration constant α, is implemented:

$$env(t)=(1-\alpha)\cdot env(t-1)+\alpha\cdot |x(t)|$$

Where env(t) denotes the estimated envelope at time t, and |x(t)| denotes the amplitude of the low-frequency signal, supplied to the input of module 26, at time t.

In a comparison 54, following the calculation 52 of the average envelope, it is checked whether the estimated average envelope at time t is greater than or equal to the previously calculated signal level L(t).

In case of a positive response in step 54, the level L(t) is updated (step 56), so that the level L(t) is equal to the maximum of the average envelope.

The update (step 56) of the signal level at time t uses the following formula:

$$L(t)=env(t)$$

The signal level is temporarily recorded.

Thus, the signal level is set to the maximum value (local maximum) of the average signal envelope, which corresponds to a transient attack phase in the processed audio signal, which is the low-frequency signal.

In addition, a timer is reset to zero when the signal level is updated (step 55).

In case of a negative response to the comparison 54, a delay step 58 is implemented, using the time counter set to zero in step 55. The time counter is incremented (step 58) and then compared (step 60) to a predetermined timing.

If the value of the time counter reaches or exceeds the delay time (test 60), while the estimated envelope value at time t is lower than the maximum signal level, the signal level is decremented (step 62) by a decrement value $\Delta_{dB}$. For example, the decrement value is in the order of 1 dB and the delay time is in the order of 1 second.

The decrementing step 62 implements, using a previously recorded signal level L(t−1):

$$L(t)=L(t-1)-\Delta_{dB}$$

It should be noted that during the delay time, the signal level remains equal to the recorded level, which is the local maximum of the mean square value of the envelope.

The use of timing advantageously allows attacks to be taken into account throughout an audio signal recording.

In parallel, and in real time, the method includes a step 64 of implementing the silence detection block 44, and in case of a positive detection, the estimated maximum level is set to zero (step 66).

Advantageously, the implementation of a silence detection allows a reset of the parameters of the module 26 between two successive recordings, thus avoiding a level adjustment based on a previous recording at the beginning of the sound rendering of a following recording.

For example, in one embodiment, the silence detection block implements time tracking of the amplitude of the low-frequency signal envelope over a predetermined silence detection time, for example of the order of two seconds.

If the amplitude is below a first $N_{dB}$ amplitude threshold, for example −80 dB, during the predetermined silence detection time, then the silence detection is positive.

Alternatively, the silence detection is performed differently, for example according to information transmitted by the audio signal source 6.

The respective steps of changing the recorded signal level L(t) 56, 62 and 66 are followed by a step 68 of calculating the slope of the module 22.

In one embodiment, the slope s(t) is calculated by the following linear interpolation formula:

$$s(t)=s_1+\frac{s_2-s_1}{L_h-L_b}\cdot L(t)$$

Where $s_1$ is a first slope value to be applied to first low level audio signals $L_b$ and $S_2$ is a second slope value to be applied to second high level audio signals $L_h$.

The low $L_b$ and high $L_h$ levels are expressed in dB.

For example, the first low level $L_b$ averages less than −12 dBrms, the second high level $L_h$ averages more than −6 dBrms.

Preferably, the first and second slope values $s_1$ and $s_2$ are calculated from the first parameter $B_1$ and the second parameter $B_2$, which are predetermined and provided by a sound engineer in a calibration phase, by the formulas:

$$s_1 = 1 + \frac{B_1}{\text{IN\_max} - Thr}$$

and $$s_2 = 1 + \frac{B_2}{\text{IN\_max} - Thr}$$

Where Thr is the trigger threshold at which the augmentation module 22 applies the expansion, and IN_max is the maximum level that the input signal can reach, for example 0 dBfs, where fs stands for "Full Scale" for a digital process.

Figure 5:
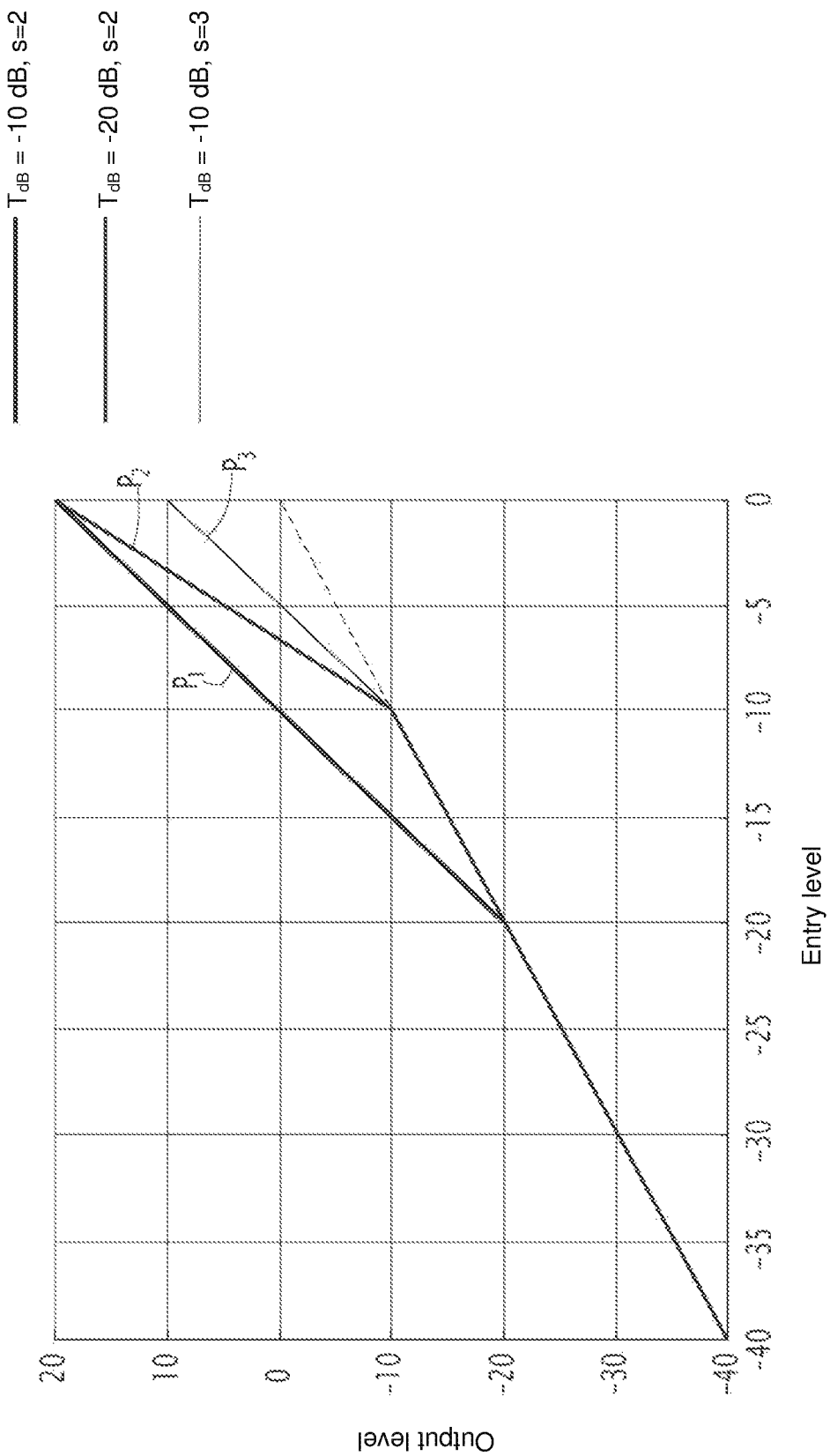
FIG. 5 shows schematically examples of dynamic range expansion slopes of an audio signal.

FIG. 5 schematically illustrates by way of example the slope of a signal dynamic range enhancement module 22 for several trigger threshold values Thr=$T_{dB}$ which are −10 B and −20 dB respectively and slope values s=2 and s=3.

In detail, FIG. 5 shows a graph comprising the output signal level of the dynamic range enhancer module 22 (in dB), plotted on the y-axis, against the input signal level (input level) in dB on the x-axis.

Between the origin of the graph and the input level equal to the trigger level $T_{dB}$ (threshold level) the slope of the straight line portion represented is equal to 1.

Respective straight lines are represented, the straight line $P_1$ corresponding to a slope of s=2 from −20 dB, the straight line $P_2$ of slope s=3 from −10 dB and the straight line $P_3$ of slope s=2 from −10 dB. At an input level of 0 dB, an amplification of 20 dB is obtained either by applying $P_1$ or $P_2$.

Advantageously, the amplification level is adjusted by adjusting the slope value of the dynamics enhancement module, depending on the first transient phases (i.e. attacks) of each input low-frequency audio signal, for each separate recording.

Figure 6:
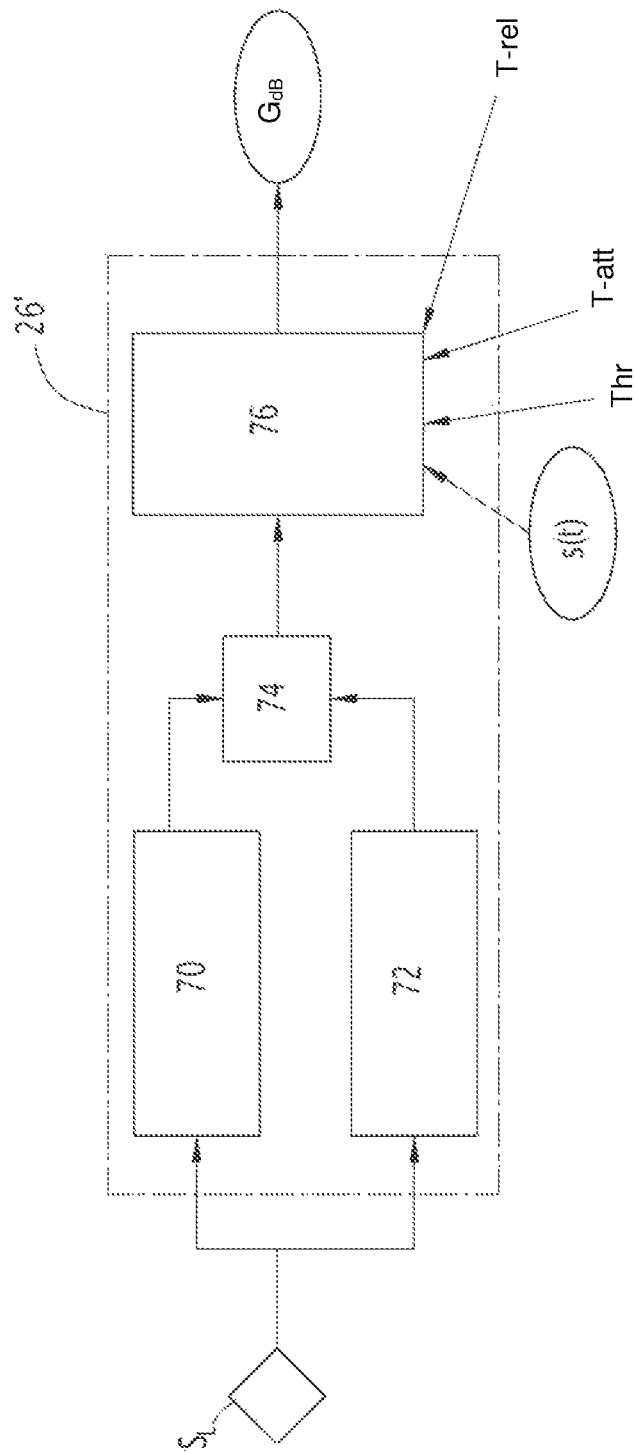
FIG. 6 shows schematically a second embodiment of a module for analysing a low-frequency audio signal and adjusting the parameters of a dynamics enhancement module.

FIG. 6 shows schematically the second mode of implementation of the module for analysing and adjusting the parameters of the dynamic increase module 22. This second embodiment implements a Crest Factor Envelope.

It should be noted that this second embodiment can be combined with the first embodiment.

In this second embodiment, the parameter of the signal dynamics enhancement module 22 is an expansion gain parameter, and the module 26' comprises functional blocks, which are:
- a block 70 for calculating the peak envelope of the low-frequency signal $S_L$, supplied at the input of the module 26';
- a block 72 for calculating the root mean square (RMS) value of the envelope of the low-frequency signal, for example a first-order infinite impulse response filter (IIR filter);
- a block 74 for calculating an envelope with a crest factor, by subtracting the mean square value of the envelope from the peak value, expressed in decibels, at the same time;
- a block 76 for calculating the expansion gain of the module 22 as a function of the crest factor envelope.

Advantageously, the use of an envelope with a crest factor makes it possible to get rid of absolute level variations, due to the type of recording, and to better adapt the increase in dynamics to the percussion attacks of each processed low-frequency audio signal.

The low-frequency signal peak envelope calculation block 70 is configured to implement any known audio signal peak envelope calculation method.

Similarly, the audio signal envelope mean square value calculation block 72 is configured to implement any known audio signal envelope mean square value calculation method.

In a particular embodiment, block 70 implements the following calculation:

$$pk\_env(t) = (1-\alpha_{pk}) \cdot pk\_env(t-1) + \alpha_{pk} \cdot |x(t)|$$

Where $x(t)$ is the low-frequency signal, $|x(t)|$ is the modulus of this signal, pk_env(t) is the estimate of the peak envelope of the audio signal $x(t)$ at time t, and $\alpha_{pk}$ is a parameter that is defined by:

$$\alpha_{pk} = \begin{cases} rel_{pk}, & |x(t)| < pk\_env(t-1) \\ att_{pk}, & |x(t)| \geq pk\_env(t-1) \end{cases}$$

Where $rel_{pk}$ is the release time of the peak envelope and $att_{pk}$ is the attack time of the peak envelope, considering $att_{pk} << rel_{pk}$.

In a particular embodiment, block 72 implements the following calculation:

$$rms\_env(t) = (1-\alpha_{rms}) \cdot rms\_env(t-1) + \alpha_{rms} \cdot |x(t)|$$

Where $x(t)$ is the low-frequency signal, $|x(t)|$ is the modulus of this signal, rms_env(t) is the estimate of the root mean square value of the envelope of the audio signal $x(t)$ at time t, also known as the RMS envelope, and $\alpha_{rms}$ is a parameter that is defined by:

$$\alpha_{rms} = \begin{cases} rel_{rms}|x(t)| < rms\_env(t-1) \\ att_{rms}|x(t)| \geq rms\_env(t-1) \end{cases}$$

Where $rel_{rms}$ is the release time of the RMS envelope and $att_{rms}$ is the attack time of the RMS envelope, considering $att_{rms} \approx rel_{rms}$.

The values of the constants $rel_{pk}$, $att_{pk}$, $rel_{rms}$, $att_{rms}$ are for example predetermined.

In one embodiment, the peak envelope calculation block 74 implements the following calculation, with the quantities expressed in decibels:

$$crest\_env\_dB(t) = pk\_en\_dB(t) - rms\_env\_dB(t)$$

Where $$pk\_env\_dB(t) = 20 \cdot \log_{10}(pk\_env(t)) \text{ and}$$

$$rms\_env\_dB(t) = 20 \cdot \log_{10}(rms\_env(t))$$

The value of the envelope with a crest factor crest_env_dB(t), calculated in decibels, corresponds in the linear domain to the division of the peak value by the mean square value of the signal envelope at the same time t.

The calculation of the expansion gain $G_{dB}(t)$ of the signal dynamics enhancement module 22 is performed as follows in one embodiment:

$$G_{inst}(t)=DRC(\text{crest\_env\_dB}(t))$$

Where $G_{inst}$ is the instantaneous gain, and DRC(x) is a dynamics control function defined by:

$$DRC(x) = \begin{cases} 0, & x < Thr \\ \gamma \cdot (x - Thr), & x \geq Thr \end{cases}$$

Where Thr is the trigger threshold at which the augmentation module 22 applies expansion (in dB), and $\gamma$ is a parameter defined as a function of the slope s(t):

$$\gamma = 1 - s(t)$$

The slope s(t) may be of predetermined value s(t)=s, provided as an input parameter.

Figure 4:
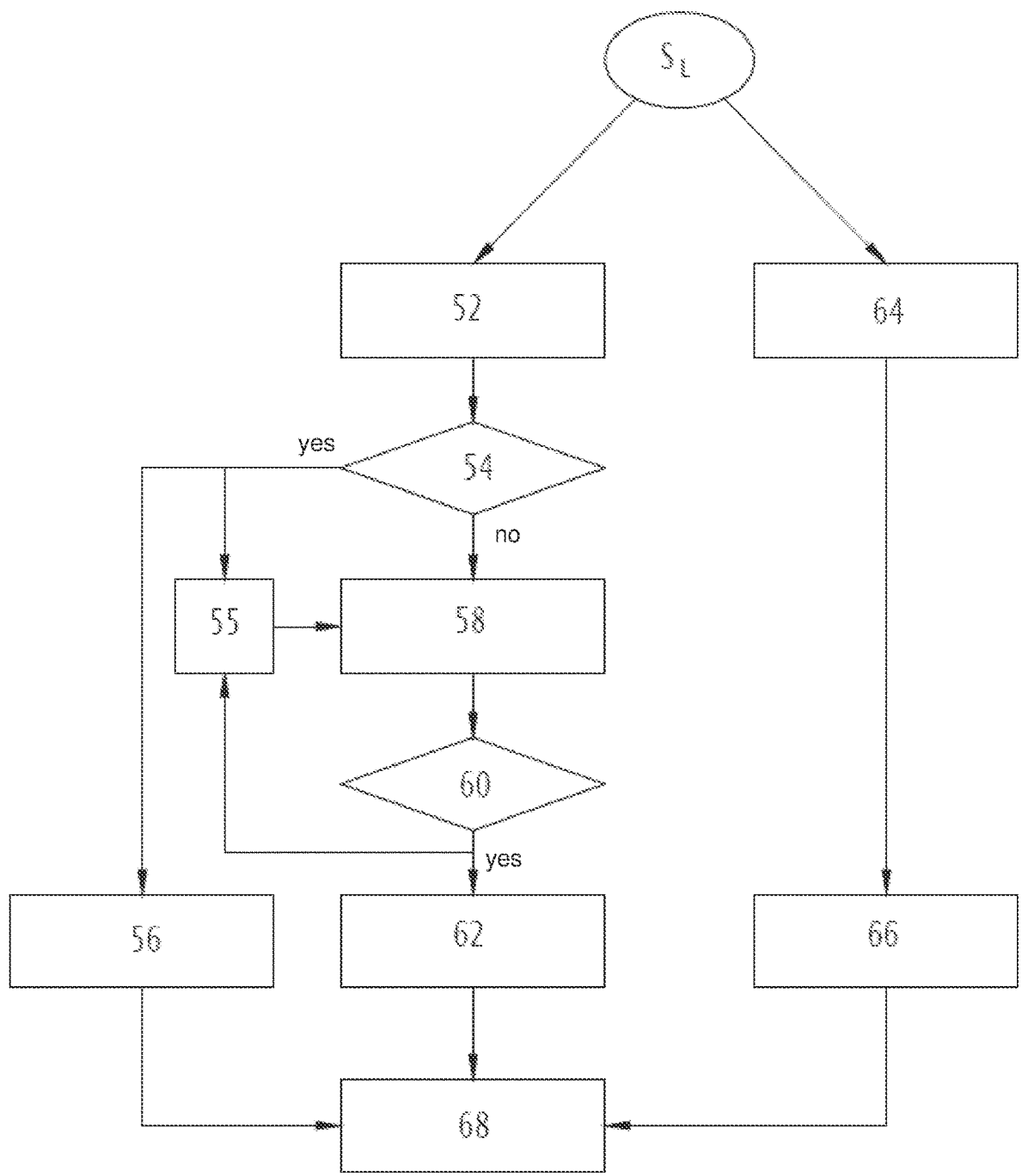
FIG. 4 is a flowchart of the main steps of a method for diagnosing operation according to one embodiment.

Preferably, the slope s(t) is adjusted dynamically, according to the method described with reference to FIG. 4.

Preferably, the instantaneous gain is smoothed by implementing the following formula:

$$G_{dB}(t) = (1-\alpha) \cdot G_{dB}(t-1) + \alpha \cdot G_{inst}(t)$$

The coefficient $\alpha$ depends on the attack time T_att and release time T_rel of the module 22:

$$\alpha = \begin{cases} T_{rel}, & G_{inst}(t) < G_{dB}(t) \\ T_{att}, & G_{inst}(t) \geq G_{dB}(t) \end{cases}$$

In the linear domain, the expansion gain is expressed as:

$$G(t) = 10^{\frac{G_{dB}(t)}{20}}$$

Figure 7:
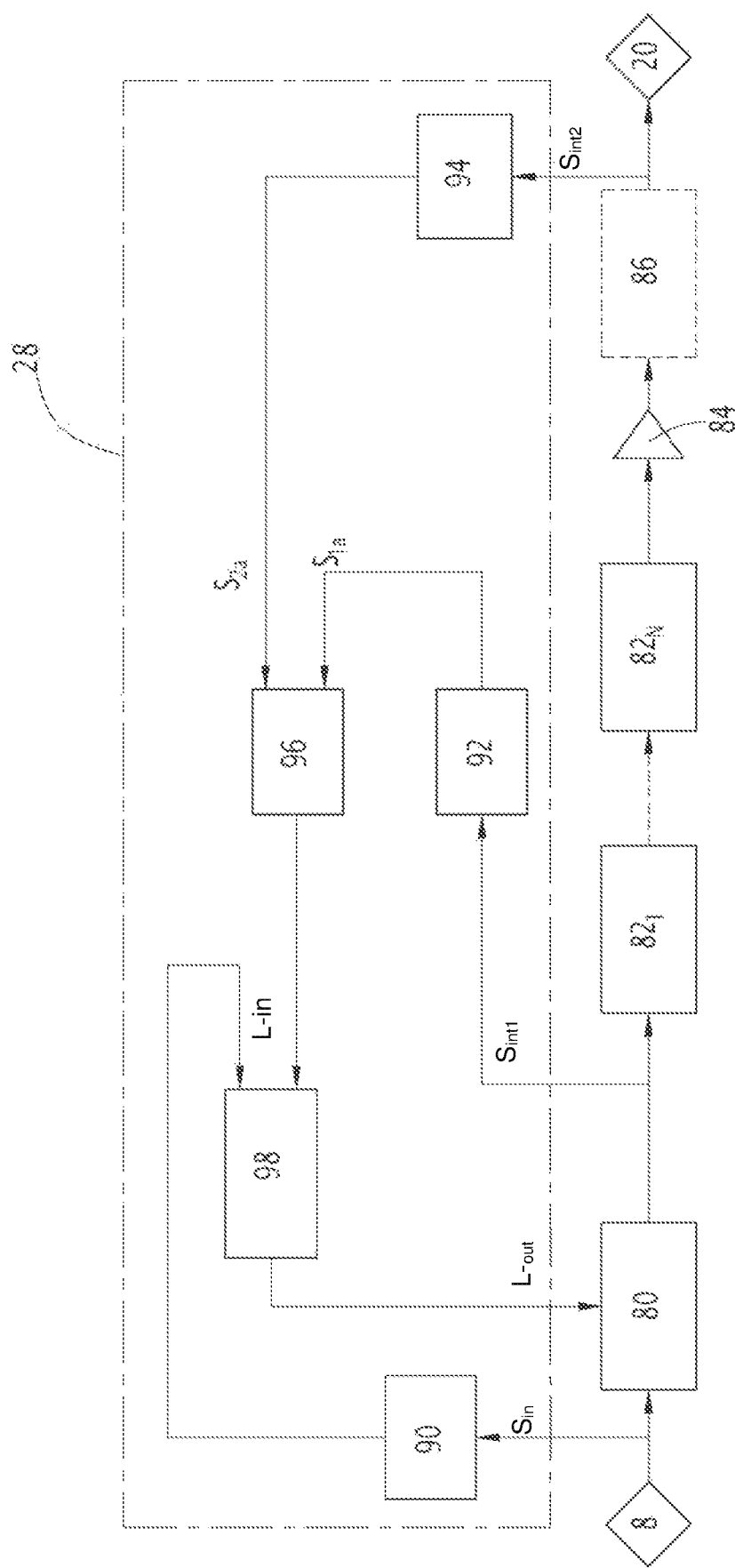
FIG. 7 schematically represents a module for estimating the level of the output audio signal of an audio system.

FIG. 7 shows schematically an embodiment of a module 28 for estimating the level L_out of the output audio signal.

This level is calculated, substantially in real time, as a function of an actual sound pressure value in the space in which the audio system 2 is installed, for example the cabin of a motor vehicle. Thus, the level of the output audio signal is representative of the actual volume at the output 20 of the audio system 2.

The module 28 for estimating the level of the output audio signal of the audio system 2 receives, on the one hand, as input the audio signal from the audio source 6 which supplies audio signals to the audio system 2, noted $S_{in}$, and then a first intermediate audio signal $S_{int1}$, formed of a first number P1 of channels, obtained at the output of the signal level-dependent processing block 80, which advantageously implements the module 4 for improving the sound rendering of the low frequencies in one embodiment, and a second intermediate audio signal $S_{int2}$, formed of a second number P2 of channels, obtained at the output of the audio system 2, after application of the N audio processing blocks 82₁ à 82_N, of the output gain 84 and of the limiter 86. The first and second numbers of channels are integers, where the first number of channels can be different from the second number of channels.

In the case where a threshold of the volume limiter 86 is implemented, the effective volume, and thus the effective sound pressure value, is no longer correlated to the volume step controlled by the user via a human machine interface of the audio system (e.g. a volume control knob or any other, possibly digital, volume control device) above a certain level.

Alternatively, if the audio system 2 does not have a limiter 86, the second intermediate signal is obtained at the output of the output gain block 84.

The module 28 for estimating the level L_out of the output audio signal comprises a block 90 for estimating the level L_in of the input signal $S_{in}$, a first channel averaging block 92, a second channel averaging block 94.

Block 90 receives as input the audio signal $S_{in}$ (input audio signal), and calculates the level L_in of this input audio signal.

In one embodiment, the level L_in of the input audio signal is estimated by implementing steps 52 to 66 described with reference to FIG. 4 above.

The first intermediate audio signal(s) $S_{int1}$ on the P1 channels are input to the first channel averaging block 92 to obtain a first average signal $S_{1a}$ equal to the average of the first intermediate audio signals $S_{int1}$ of each of the P1 channels.

The second intermediate audio signal(s) $S_{int2}$ on the P2 channels are input to the second channel averaging block 94 to obtain a second average signal $S_{2a}$ equal to the average of the second intermediate audio signals $S_{int2}$ of each of the P2 channels.

The first average signal $S_{1a}$ and the second average signal $S_{2a}$ are input to a level difference estimation block 96 between two points in the audio system, which implements a difference calculation between a first intermediate level $L_1$ of the first average signal $S_{1a}$ and a second intermediate level $L_2$ of the first average signal $S_{2a}$.

In one embodiment, for each of the first average signal $S_{1a}$ and the second average signal $S_{2a}$, a level estimation method similar to that implemented by block 90 is applied.

Next, block 96 implements the following difference calculation:

$$L = L_2 - L_1 + L_{off}$$

Where $L_{off}$ is a calibration level, also called offset level, previously calculated during a calibration phase of the audio system and stored, the calibration being performed on an audio signal of known level, for example pink noise of known level.

It should also be noted that a latency compensation between the first average signal $S_{1a}$ and the second average signal $S_{2a}$ is applied, for example a delay is applied to the first average signal $S_{1a}$ so that the level difference is applied at the same time.

The result of the level difference block 96 between two points in the audio system is provided as input to an output level calculation block 98 L_out.

The input signal level L_in is also provided at the input of block 98.

The output level estimation block 98 of the audio system uses the two input levels to estimate the L_out level.

For example, in an audio system, parameters of low level $L_b$, high level $L_h$, a maximum bias $\Delta L_b$ allowed between a high level recording and a low level recording are provided, for example by a sound engineer during a calibration phase.

In one embodiment, the estimated L_out level is calculated as follows.

A bias $\Delta L$ is defined by:

- If $L\_in > L_h$, $\Delta L = 0$
- If $L\_in < L_b$, $\Delta L = \Delta L_b$

-continued

- If $L_b \leq \text{L\_in} \leq L_h$, then $\Delta L = \Delta L_b * \left(\frac{\text{L\_in} - L_h}{L_b - L_h}\right)$ And:

If L_out≥$L_b$, L_out=L+ΔL

Advantageously, the level L_out calculated in this way is representative of the actual listening volume, and therefore allows for a more suitable adjustment for a user than any system based solely on input parameters of the audio system.

The level L_out of the output audio signal is used in the low-frequency signal dynamic range enhancement module 22, and in the amplification module 40.

In one embodiment, the parameters $B_1$, $B_2$ and Thr of the module 26 that drives the low-frequency signal boosting module 22 are adjusted according to the estimated level L_out.

The estimated level L_out of the output audio signal is used to adjust the slope of the module 26, by increasing or decreasing the predetermined expansion gain $G_{dB}$.

The estimated level L_out of the output audio signal is used to adjust the gain of the amplifier 40, by increasing or decreasing the predetermined $G_H$ harmonic gain.

If the estimated level L_out of the output audio signal is low, e.g. below a predetermined threshold, then the gain of the $G_H$ and $G_{dB}$ harmonics are as preset.

If the estimated level L_out of the output audio signal is high, e.g. above the predetermined threshold, the listening level (loudness) is high, so less bass processing is applied. For example, the $G_H$ harmonic gain and the $G_{dB}$ expansion gain are decreased.

In one embodiment, the system 5 for enhancing the low-frequency sound of an audio signal implements the adjustment of the expansion slope and expansion gain of the dynamic expansion module 22 and the output audio signal level estimation module 28 of the audio system 2.

According to a sub-optimal variant, the system 5 for enhancing the low-frequency sound of an audio signal implements the adjustment of the expansion slope and/or the expansion gain of the dynamic expansion module 22 as described above, and the output level L_out of the audio system 2 is estimated by a different method, for example according to a user-controlled volume step.

Advantageously, the method and system for improving the sound rendering of the low frequencies of an audio signal implement an analysis of the audio signal in real time, making it possible to distinguish between old and modern recordings, so as to adapt the increase in the dynamic range of the low frequencies in real time, on a case by case basis.

Advantageously, the invention also makes it possible to adapt the improvement of the sound rendering of the low frequencies according to a listening volume estimated in real time.

The invention claimed is:

1. A method of improving the low-frequency sound rendering of an audio signal, the sound rendering being performed by an audio system comprising at least one loudspeaker, the method comprising:
   separating an input audio signal by filtering the audio input into a high-frequency signal and a low-frequency signal,
   generating a low-frequency output signal by a first processing of the low-frequency signal;
   generating a high-frequency output signal by a second processing of the high-frequency signal; and
   generating an output audio signal based on a summation of the low-frequency output signal and the high-frequency output signal, the output audio signal being supplied as input to a set of audio processing blocks of the audio system,
   wherein the first processing of the low-frequency signal comprises adjusting the dynamic range of the low-frequency signal as a function of at least one transient part of said low-frequency signal,
   wherein generating the output audio signal further comprises performing an analysis of the low-frequency signal, said analysis comprising a calculation of a level of the at least one transient part of the low-frequency signal, and wherein adjusting the dynamic range of the low-frequency signal further comprises adjusting at least one parameter of a dynamic range enhancement module that adjusts the dynamics of the low-frequency signal as a function of the calculated level; and
   wherein the at least one adjusted parameter comprises a dynamic range slope, said slope being calculated as a function of said low-frequency signal level, a first slope value to be applied for predetermined first low level audio signals, and a second slope value to be applied for predetermined second high level audio signals.

2. The method according to claim 1, wherein the audio signal comprises a musical recording, said method comprising detecting said at least one transient part comprising at least one attack, said attack corresponding to an amplitude rise of the audio signal.

3. The method according to claim 1, wherein adjusting the dynamic range of the low-frequency signal further comprises, for the at least one transient part, generating the low-frequency output signal by increasing the dynamics of the low-frequency signal as a function of the calculated level, and further comprises, for a different transient part of said low-frequency signal during which silence is detected, resetting of the at least one parameter.

4. The method according to claim 1, comprising calculating a crest factor envelope of the low-frequency signal, and calculating an expansion gain of the dynamic range enhancement module as a function of the crest factor envelope.

5. The method according to claim 4, wherein the calculation of the crest factor envelope comprises a calculation of a peak envelope of the low-frequency signal, a calculation of an average envelope of the low-frequency signal, the crest factor envelope being equal, at a time instant, to a decibel difference between the peak envelope and the average envelope at said time instant.

6. The method according to claim 1, further comprising estimating a level of the output audio signal, representative of an actual sound volume at the output of the audio system, as a function of an estimated level of the input audio signal to the audio system, and a difference between a second intermediate level and a first intermediate level of the audio signal in the audio system, the second intermediate level being the level of a second intermediate signal obtained at the output of a limiter or an output gain of the audio system.

7. The method according to claim 1, wherein the first processing comprises, after adjusting the dynamic range of the low-frequency signal, obtaining a first output signal by applying phase compensation to the dynamic range-adjusted low-frequency signal.

8. The method according to claim 1, wherein the first processing further comprises applying a harmonic generation module to the low-frequency signal, substantially in parallel with adjusting the dynamic range of the low-frequency signal, obtaining a second output by applying shaping filters to the low-frequency signal.

9. A processing system for improving the low-frequency sound rendering of an audio signal, the sound rendering being performed by an audio system comprising at least one speaker, the processing system comprising a low-frequency sound enhancement module comprising filters for separating an input audio signal into a high-frequency signal and a low-frequency signal, the processing system being configured to implement a first processing of the low-frequency signal to obtain a low-frequency output signal and a second processing of the high-frequency signal to obtain a high-frequency output signal, and a summation of the low-frequency output signal and the high-frequency output signal to obtain an output audio signal supplied as input to a set of audio processing blocks of the audio system, the low-frequency sound enhancement module configured, for said first processing of the low-frequency signal, to increase the dynamics of the low-frequency signal, parameterised as a function of at least a transient part of said low-frequency signal, wherein said low-frequency sound enhancement module comprises a module for analysing and adjusting in real time the parameters of a low-frequency signal dynamics enhancement module, comprising a silence detection block, a low-frequency signal root mean square calculation block, a low-frequency signal level calculation block and a low-frequency signal dynamics enhancement module slope calculation block.

10. The processing system according to claim 9, wherein the low-frequency sound enhancement module comprises a module for analysing and adjusting the parameters in real time, a module for increasing the dynamics of the low-frequency signal, comprising a block for calculating the peak of an envelope of the low-frequency signal, a block for calculating the mean square value of the low-frequency signal, a block for calculating a crest factor envelope, equal to a decibel difference between the peak envelope and the mean envelope, and a block for calculating expansion gain as a function of the crest factor envelope.

11. The processing system according to claim 9, further comprising a module for estimating a level of the output audio signal, representative of an actual sound volume at the output of the audio system, comprising a block for estimating a level of the input audio signal to the audio system and a block for estimating a difference between a second intermediate level and a first intermediate level of the audio signal in the audio system, the second intermediate level being the level of a second intermediate signal obtained at the output of a limiter or an output gain of the audio system.

12. An audio system comprising at least one speaker and the processing system of claim 9.

13. A method of improving the low-frequency sound rendering of an audio signal, the sound rendering being performed by an audio system comprising at least one loudspeaker, the method comprising:

separating an input audio signal by filtering the audio input into a high-frequency signal and a low-frequency signal, generating a low-frequency output signal by a first processing of the low-frequency signal;

generating a high-frequency output signal by a second processing of the high-frequency signal; and generating an output audio signal based on a summation of the low-frequency output signal and the high-frequency output signal, the output audio signal being supplied as input to a set of audio processing blocks of the audio system, wherein the first processing of the low-frequency signal comprises adjusting the dynamic range of the low-frequency signal as a function of at least one transient part of said low-frequency signal, and wherein the method further comprises estimating a level of the output audio signal, representative of an actual sound volume at the output of the audio system, as a function of an estimated level of the input audio signal to the audio system, and a difference between a second intermediate level and a first intermediate level of the audio signal in the audio system, the second intermediate level being the level of a second intermediate signal obtained at the output of a limiter or an output gain of the audio system.

14. A method of improving the low-frequency sound rendering of an audio signal, the sound rendering being performed by an audio system comprising at least one loudspeaker, the method comprising:

separating an input audio signal by filtering the audio input into a high-frequency signal and a low-frequency signal, generating a low-frequency output signal by a first processing of the low-frequency signal;

generating a high-frequency output signal by a second processing of the high-frequency signal; and generating an output audio signal based on a summation of the low-frequency output signal and the high-frequency output signal, the output audio signal being supplied as input to a set of audio processing blocks of the audio system;

wherein the first processing of the low-frequency signal comprises adjusting the dynamic range of the low-frequency signal as a function of at least one transient part of said low-frequency signal; and wherein the first processing further comprises applying a harmonic generation module to the low-frequency signal, substantially in parallel with adjusting the dynamic range of the low-frequency signal, obtaining a second output by applying shaping filters to the low-frequency signal.

\* \* \* \* \*